US012812820B2

(12) United States Patent
Nagimov

(10) Patent No.: US 12,812,820 B2
(45) Date of Patent: Nov. 24, 2026

(54) THERMO-MECHANICAL POWER SMOOTHING FOR DISTRIBUTED COMPUTATION SERVERS

(71) Applicant: Microsoft Technology Licensing, LLC, Redmond, WA (US)

(72) Inventor: Ruslan Nagimov, Snohomish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 376 days.

(21) Appl. No.: 18/647,649

(22) Filed: Apr. 26, 2024

(65) Prior Publication Data

US 2025/0338456 A1 Oct. 30, 2025

(51) Int. Cl.
*H05K 7/20* (2006.01)
*G06F 1/20* (2006.01)

(52) U.S. Cl.
CPC ......... *H05K 7/20836* (2013.01); *G06F 1/206* (2013.01)

(58) Field of Classification Search
None
See application file for complete search history.

(56) References Cited

U.S. PATENT DOCUMENTS

| | | | | |
|---|---|---|---|---|
| 2018/0267589 | A1 | 9/2018 | Goodward et al. | |
| 2019/0265764 | A1 | 8/2019 | Ping | |
| 2021/0084797 | A1 * | 3/2021 | Shao | G06F 1/206 |
| 2021/0350952 | A1 | 11/2021 | Singh | |
| 2023/0118372 | A1 | 4/2023 | Miller | |

OTHER PUBLICATIONS

International Search Report and Written Opinion received for PCT Application No. PCT/US2025/016177, Apr. 11, 2025, 15 pages.

* cited by examiner

*Primary Examiner* — Ryan A Jarrett
(74) *Attorney, Agent, or Firm* — Holzer Patel Drennan

(57) ABSTRACT

In large-scale machine-learning (ML) and/or artificial intelligence (AI) model training, large groupings of GPU servers are tasked with a distributed periodic computational workload. This causes power draw by the GPU servers to periodically and repeatedly fluctuate from nearly zero to full load. The presently disclosed thermo-mechanical power smoothing devices and techniques utilizing a distributed network of high-speed fans as thermo-mechanical energy storage devices for consuming underutilized power and storing it in the form of thermal energy and mechanical energy for future reuse.

20 Claims, 6 Drawing Sheets

THERMO-MECHANICAL POWER SMOOTHING FOR DISTRIBUTED COMPUTATION SERVERS

BACKGROUND

Large-scale machine-learning (ML) and/or artificial intelligence (AI) model training is a distributed computation that can involve thousands of graphical processing units (GPUs) interconnected by high-bandwidth networks, such as InfiniBand (IB). To train a large language model, for example, a computational workload is partitioned across thousands of GPUs interconnected in a GPU cluster. At certain phases in this computation, a collecting operation (e.g., Allreduce) collects and combines the information generated by the GPUs. The GPUs are substantially idled until the collecting operation is complete and the GPUs begin the next computational workload.

SUMMARY

Implementations described and claimed herein address the problems described below by providing a server comprising an array of processors that operate with a synchronous fluctuating workload and a corresponding synchronous fluctuating net power consumption over time, an array of variable speed cooling fans to supply cooling air to the processors and operate as thermo-mechanical power smoothing devices for the server, and a controller. The controller sets cooling fan speed to MAX in response to a low power consumption state of the processors and sets cooling fan speed to AUTO in response to a high-power consumption state of the processors.

Other implementations are also described and recited herein.

DETAILED DESCRIPTION

Figure 1:
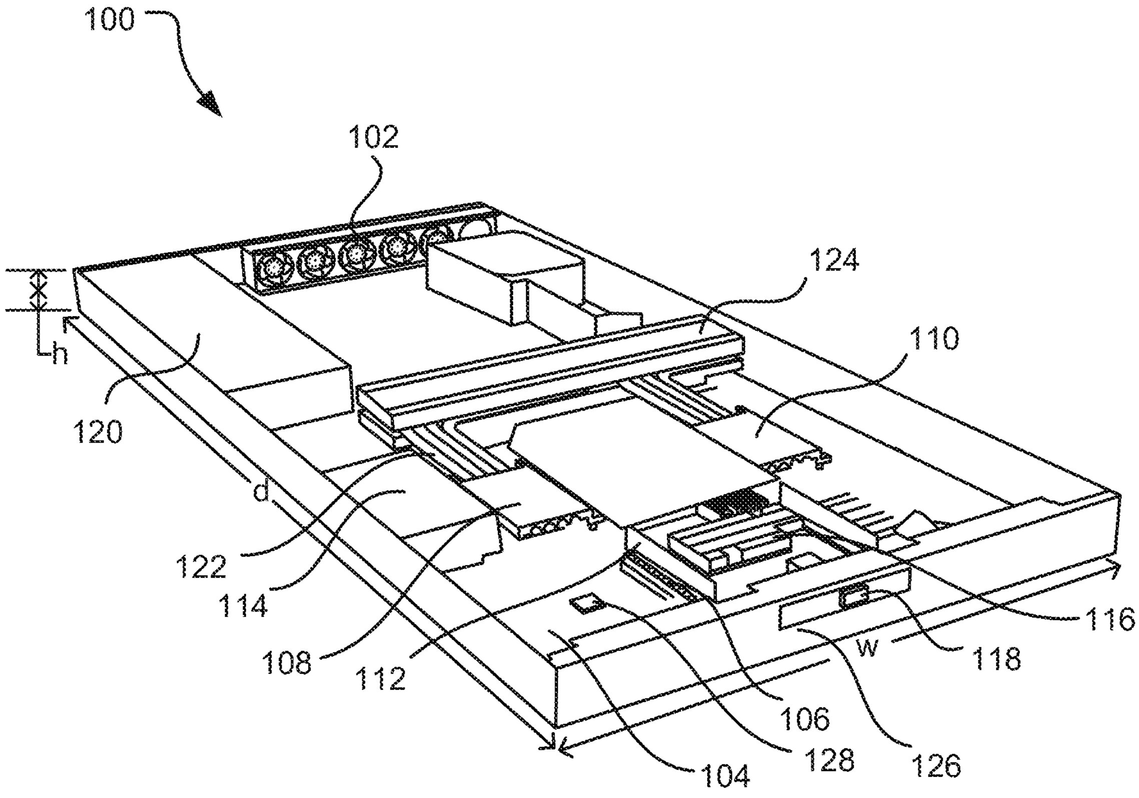
FIG. 1 illustrates an example graphical processing unit (GPU) server with integrated cooling fans operating as thermo-mechanical power smoothing devices.

Graphical processing unit (GPU) servers are servers with one or more graphics processing units (GPUs) that offer increased power and speed for running computationally intensive tasks, such as video rendering, data analytics, and machine learning. In datacenters tasked with large-scale machine-learning (ML) and/or artificial intelligence (AI) model training, large groupings of GPU servers are arranged in clusters and tasked with a distributed computational workload. Once the computational workload is complete, a collecting operation (e.g., Allreduce) collects the data from the different GPU servers and combines the data into a global result. This result is then distributed back to the GPU servers and a next computational workload begins. As a result, the computation workload occurs in stages with the collecting operation completing a stage. While the collecting operation is running, the GPU servers are substantially idled waiting for the next computational workload to begin.

As a result, the computational workload on the GPU servers is periodic and the GPUs cycle between on and off states together. This yields a synchronous workload that causes power draw by the GPU servers to periodically and repeatedly fluctuate from nearly zero to full load. This can cause issues with the power grid or other power delivery systems, stress uninterruptible power supply (UPS) batteries and generators, cause voltage oscillations, and potentially propagate a resulting noise back into the power grid.

"Purely-electrical" solutions to the power oscillation caused by the GPU server clusters involve expensive storage techniques (e.g., batteries and/or capacitors) or wasted energy in "dummy loads" (e.g., resistive banks and/or heaters). The presently disclosed thermo-mechanical power smoothing devices and techniques utilizing a distributed network of high-speed fans as thermo-mechanical energy storage devices for consuming underutilized power and storing it in the form of thermal energy (e.g., subcooled air-cooled components of the GPU servers) and mechanical energy (e.g., fan rotors spinning at higher-than-normal speed) for future reuse. The presently disclosed thermo-mechanical power smoothing devices and techniques can be achieved inexpensively in existing server designs. For greater energy storage capacity, fans of existing GPU servers can be retrofit with weighted rotors, defined herein as rotors made of an underlying material and/or incorporating weights that in sum render the rotor with significantly greater mass than that required for fan operation.

The following thermo-mechanical power smoothing devices and methods are technically advantageous over the foregoing "purely-electrical" solutions, and other solutions, by requiring few if any changes to GPU server designs. No new hardware and datacenter infrastructure upgrades may be required to implement the following thermo-mechanical power smoothing devices and methods. Further, power management software could be updated to utilize the disclosed technology without any hardware changes. In comparison, resistor banks and UPS-based solutions require power infrastructure upgrades and local battery-based solutions require changes to PSUs/server chassis. Further, the following thermo-mechanical power smoothing devices and methods are very low wear as compared to chemical-based storage (e.g., batteries and UPS) assuming low-friction hydrodynamic bearings are in use on the cooling fans. Still further, the following thermo-mechanical power smoothing devices utilize high-speed fans for a dual purpose, cooling, and energy storage. By using high-speed fans as replacements for existing fans, no additional points of failure introduced (as compared to additional batteries, load switching gear, etc.).

Further still, the following thermo-mechanical power smoothing devices and methods can achieve net power savings while being as reliable as or more reliable than resistive heating solutions.

FIG. 1 illustrates an example graphical processing unit (GPU) server 100 with integrated cooling fans (e.g., cooling fan 102) operating as thermo-mechanical power smoothing devices. The server 100 includes a system board 104 upon which a variety of microelectronic components are attached and interconnected via various ports (e.g., Peripheral Component interconnect Express (PCIe) port 106). Processors 108, 110 (e.g., discrete, or integrated microelectronic chips and/or separate but integrated processor cores, including but not limited to central processing units (CPUs) and graphic processing units (GPUs)) and at least one memory device (e.g., dual in-line memory module (DIMM) 114), are integrated components of the server 100. The server 100 may also include data storage devices (e.g., solid state drive (SSD) 112 and/or flash or hard disk drives), and other input/output (I/O) devices (not shown). Any or all of the foregoing components of the server 100 may be integrated as chips of the server 100 or separate devices connected to the server 100.

The I/O devices may permit a user to enter commands and information (e.g., via a keyboard or mouse). These and other input devices may be coupled to the server 100 by one or more I/O interfaces, such as a serial port interface, parallel port, and/or universal serial bus (USB). The memory device(s) and/or the data storage device(s) may include one or both of volatile memory (e.g., random-access memory (RAM)) and non-volatile memory (e.g., flash memory or magnetic storage). An operating system (OS), such as one of the varieties of Linux or the Microsoft Windows® operating system resides in the memory device(s) and/or the storage media and is executed by at least one of the processors 108, 110, although other OSs may be employed. Other software applications may also be loaded in the memory device(s) and/or the storage media and executed within the OS by at least one of the processors 108, 110.

The server 100 may be a remote control and/or physically controlled device and is a network-connected and/or network-capable device. Network adapter 116 is connected to networking port 118 (e.g., a quad small form factor pluggable (QSFP) networking port) to provide network connectivity to one or more other servers and/or client devices within a data network, such as a wide-area network (WAN) or local-area network (LAN). The server 100 may further include a power supply 120 (or be connected to an external power supply), which is powered by one or more batteries or other power sources and provides power to the server 100. The power supply 120 may also include its own batteries or capacitors to store energy for momentary interruptions of power. The power supply 120 may also be connected to an external power source that overrides or recharges the internal batteries or capacitors.

In some implementations, the cooling fans include regenerative braking mechanisms connected to the power supply 120 or system board 104. These regenerative braking mechanisms can recover mechanical storage capacity as electrical power for the server to bridge momentary interruptions of power. Still further, the regenerative braking mechanisms may be used to partially power the server 100 even when there is no interruption of power. Further yet, the regenerative braking mechanisms can decelerate the fans faster than would otherwise occur, which yields gains in power efficiency and a safety advantage. The regenerative braking mechanisms are technically advantageous in that they provide UPS, thermo-mechanical power smoothing, and/or electrical power efficiency benefits that would otherwise be unavailable within the server 100.

The processors 108, 110, as well as other components internal to the server 100, are conductively cooled by a network of heat pipes (e.g., heat pipe 122) that connect to a heat sink 124 or heat exchanger, such as a cold plate (e.g., carbon graphite or metallic structures intended to spread thermal energy) that is convectively cooled. The heat pipes are attached at one end to the processors 108, 110 and extend away from the processors 108, 110 to the heat sink 124. In various implementations, the heat pipes may be vapor chambers (or planar heat pipes), thermosyphons, etc. The various types, number, and configuration of heat pipes, heat sinks, and cold plates are collectively referred to herein as heat-transfer devices and may vary widely from that depicted, while maintaining the convectively cooled aspect discussed in further detail below.

In various implementations, the heat sink 124 may function to add thermal energy storage capacity to the server 100 when the processors 108, 110 are idled that may be subsequently recovered when the processors 108, 110 are again solving a computational workload generating corresponding thermal energy that is to be dissipated. The heat sink 124 is technically advantageous in that it provides another source for storing energy in the form of thermal energy, which can aid the thermo-mechanical power smoothing and electrical power efficiency benefits that would otherwise be unavailable within the server 100. Regardless of the presence, type, and arrangement of heat-transfer devices within the server 100, the cooling fans are ultimately used in conjunction with the heat-transfer devices, if present, to cool the server 100 and its internal components.

The cooling fans draw air through a front-facing perforated grid 126 acting as an intake, past the convectively cooled heat sink 124 and other internal components of the server 100 that are intended to the convectively cooled and exhaust the heated air at a rear of the server 100. As a result, the cooling airflow moves generally from the front to the rear of the server 100 and convectively cools internal components of the server 100 as it moves through the server 100.

The system board 104 includes a baseboard management controller (BMC) 128 that is tasked with managing the interface between the server 100 hardware and software running thereon. Various sensors built into the server 100 report to the BMC 128 on measured parameters such as processor workload, temperature, cooling fan speeds, power status, operating system (OS) status, etc. The BMC 128 monitors the sensors and can take thermo-mechanical power smoothing actions in response.

The processors 108, 110 operate with a synchronous and fluctuating computational workload when used for ML and/or AI model training. At certain phases in the computational workload, a collecting operation (e.g., Allreduce) collects and combines the information generated by an array of connected servers, such as the server 100. This yields a synchronous and fluctuating net power consumption that fluctuates between a minimum power consumption with the array of processors substantially idled when the collecting operation between computational workloads is running and a maximum power consumption with the processors 108, 110 fully loaded with computational workload before and after each collecting operation.

The fans are capable of running at variable speeds as demanded by the BMC 128. An action that the BMC 128 may take to effect thermo-mechanical power smoothing responsive to (or predictive of) the synchronous and fluctuating net power consumption of the processors 108, 110 is varying the operating speed of the fans. This action turns the fans into thermo-mechanical power smoothing devices that accommodates for the synchronous and fluctuating net power consumption of the processors 108, 110.

The fans are configured to operate in at least two operating states. In an automatic or AUTO operating state, the fan speed is permitted to fluctuate to maintain a desired temperature within the server 100. More specifically, the BMC 128 monitors one or more temperature sensors (not shown, see e.g., temperature sensor 240 of FIG. 2) that measure temperatures of the airflow, heat sink 124, and/or the processors 108, 110. In the AUTO operating state, the BMC 128 permits the fan speed to fluctuate to maintain the monitored temperature reading(s) within a desired operating range. Thus, one or more temperature sensor(s) provide feedback control for fan speed in AUTO. The AUTO operating state may be used as the default state for the fans.

In a MAX operating state, the fan speed to set to maximum and the actual fan speed is permitted to rise to the maximum level. The BMC 128 may use the MAX operating state when it detects (or anticipates) a low power consumption state of the processors 108, 110 (i.e., the processors 108, 110 are substantially idled). This consumes additional power, which may be helpful from a power smoothing perspective due to the low power consumption state of the processors 108, 110. This also stores mechanical energy in the rotors of the fans, which may be subsequently consumed at a later time (e.g., when the processors 108, 110 move to a high-power consumption state). This further yields a drop in temperature within the server 100 due to the increased airflow though the server 100. This lower temperature may be used later when the processors 108, 110 are again solving a computational workload generating corresponding thermal energy that is to be dissipated (e.g., when the processors 108, 110 move to a high-power consumption state).

In a LOW or OFF operating state, the fan speed is set to a minimum, which may be zero when the monitored temperature reading(s) are below a desired operating range. The LOW or OFF operating state may immediately follow the MAX operating state when the processors 108, 110 are again solving a computational workload, but the corresponding thermal energy has yet to increase the monitored temperature reading(s) to a sufficient degree to require convection cooling. In some implementations, the LOW or OFF operating state is encompassed by the AUTO operating state, which can set the fan speed to the minimum setting so long as the monitored temperature reading(s) are below the desired operating ranges.

The server 100 is arranged in a standard form factor with height (h), width (w), and depth (d) for inclusion in a rack (not shown), such as that found in various datacenters. For example, if the rack is a standard 19-inch rack, the width (w) dimension is approximately 19-inches, and the depth is approximately 37-inches. The height (h) dimension is commonly expressed in rack units (U), which are multiples of 1.75-inches. The height (h) of the server 100 may be 1 U or more U. Other rack standards are contemplated herein (e.g., 10-inch racks, European Telecommunications Standards Institute (ETSI) racks, Open Rack, etc.) and the height (h), width (w), and depth (d) may be changed accordingly to accommodate other rack standards. As appropriate.

While the processors 108, 110 are explicitly disclosed herein as GPUs and the server 100 is explicitly disclosed herein as a GPU server, other server and processor types that function with a periodically and repeatedly fluctuating workload and resulting power consumption may similarly adopt cooling fans operating as thermo-mechanical power smoothing devices. Further, while integrated cooling fans are illustrated in FIG. 1 and described above, external fans (e.g., a rack-mount fan) may be used to similar effect across several connected servers (e.g., all the servers with the rack shared with the rack-mount fan).

Figure 2:
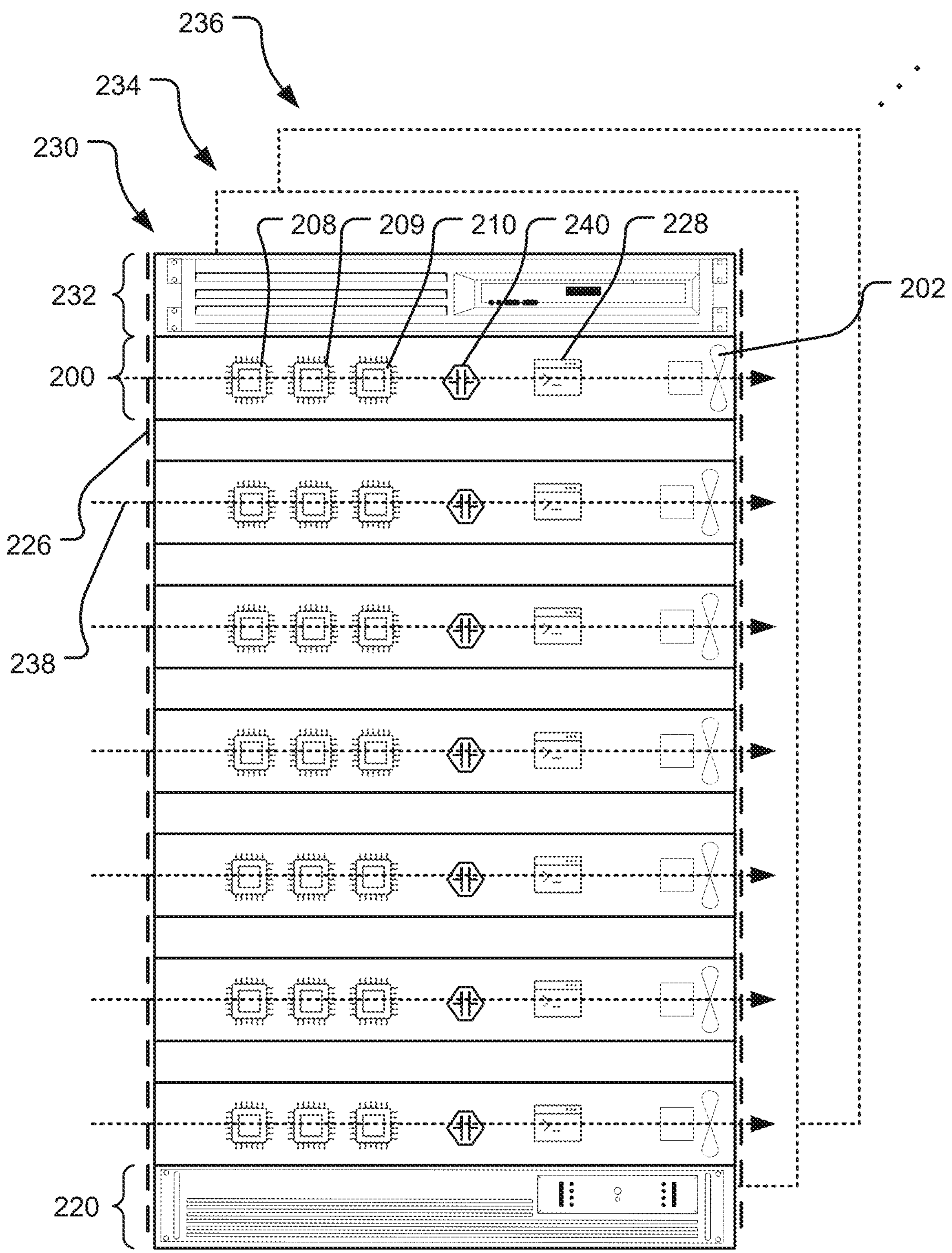
FIG. 2 illustrates an example server rack with a set of graphical processing unit (GPU) servers, each with a set of integrated cooling fans operating as thermo-mechanical power smoothing devices.

FIG. 2 illustrates an example server rack 230 with a set of graphical processing unit (GPU) servers (e.g., GPU server 200), each with a set of integrated cooling fans (e.g., cooling fan set 202) operating as thermo-mechanical power smoothing devices. The server rack 230 includes a rack controller 232, seven GPU servers, and a power supply 220 as examples. Other and different quantities of components are also mounted to the server rack 230 as the server rack 230 is modular in nature. Further, the server rack 230 is contemplated as one of many server racks (e.g., server rack 234, 236, and so on) within a data center.

The GPU servers each include a system board (not shown, see e.g., system board 104 of FIG. 1) upon which a variety of microelectronic components, including processors (e.g., processors 208, 209, 210), are attached and interconnected via various ports. The GPU servers may also each include additional connected components (e.g., heat-transfer devices), such as that shown in FIG. 1 and described above. The GPU servers may be the same or different in terms of the number and type of processor including, or other connected components.

The power supply 220 is external to the GPU servers but internal to the server rack 230, and powers the various components mounted to the server rack 230. The power supply 220 is powered by grid power, one or more batteries, or other external power sources. The power supply 220 may also include its own internal power sources, such as batteries or capacitors to store energy for momentary interruptions of power. The external power source may recharge the internal batteries or capacitors when power is available. The GPU servers may also include their own power supplies (e.g., power supply 120 of FIG. 1) in addition to or in lieu of the rack-level power supply 220 of FIG. 2.

In some implementations, the fans include regenerative braking mechanisms connected to the power supply 220 or a corresponding GPU server. The regenerative braking mechanisms can recover mechanical storage capacity as electrical power for the servers to bridge momentary interruptions of power. Still further, the regenerative braking mechanisms may be used to partially power the server rack 230 even when there is no interruption of power. The regenerative braking mechanisms are technically advantageous in that they provide UPS, thermo-mechanical power smoothing, and/or electrical power efficiency benefits that would otherwise be unavailable within the server rack 230.

The cooling fans draw air through a front-facing perforated grid 226 in the server rack 230 (or perforated grids on each of the GPU servers) acting as an air intake for the GPU servers, past internal components of the GPU servers that are intended to be convectively cooled, such as the GPU processors 208, 209, 210, and exhaust the heated air at a rear of the server rack 230, as illustrated by dotted arrows (e.g., dotted arrow 238). As a result, the cooling airflow moves generally from the front to the rear of the server rack 230 and convectively cools internal components of the GPU servers as it moves through the server rack 230.

In various implementations, the cooling fans are constructed of a heavier material than otherwise required for normal fan operation (e.g., metal alloy instead of plastic) or include weighted rotors (e.g., heavy (metal) rotors or lightweight rotors (plastic) with embedded weights) to add mechanical power storage capacity to the server rack 230 and the individual GPU servers. The mechanical storage capability of the cooling fans is defined in large part by the rotor weight and fan speed. As modern server cooling fans typically run at very high speeds (e.g., approximately 38,000 RPM for some 1U designs and approximately 18,300 RPM for some 2U designs) for power and aerodynamic efficiency reasons, this is helpful when adding weight to the rotors for additional mechanical storage capability.

Further, angular acceleration (or ramp up) of the cooling fans consumes additional energy that can be later be used when the cooling fans decelerate (or ramp down), thereby operating as flywheel energy storage devices. This is technically advantageous in that it adds mechanical power storage capacity without occupying any additional physical space within the server rack 230 and the individual GPU servers. Other implementations may add separate weighted flywheels within the GPU servers that operate similarly to the cooling fans in addition to or in lieu of operating the cooling fans as described herein. In an example implementation, four 80 mm fans with metal alloy rotors can buffer 500 W of power for 1-second with a ramp up from 4,000 RPM to 18,000 RPM. In another example implementation, ten 40 mm fans with metal alloy rotors can buffer 500 W of power for 1-second with a ramp up from 8,000 RPM to 38,000 RPM.

One example implementation smooths 500 W of GPU power using 80 mm fans in a 2U application with acrylonitrile butadiene styrene (ABS) rotors (33 g rotors). The steady-state expected fan speed is 4300 RPM in an AUTO operating speed, which draws 2 W per fan. As the GPUs move to a low power state, in order to smooth over the power drop, the 80 mm fans can ramp up to 18300 RPM in a MAX operating state, which draws up to 58 W per fan. As a result, nine fans are used to smooth 500 W of GPU power.

Another example implementation smooths 500 W of GPU power using 80 mm fans in a 2U application with steel rotors (256 g rotors). The steady-state expected fan speed is 4300 RPM in an AUTO operating speed, which draws 2 W per fan. As the GPUs move to a low power state, in order to smooth over the power drop, the 80 mm fans can ramp up to 18300 RPM in a MAX operating state, which draws up to 58 W per fan. However, due to the increased inertial mass of the steel rotors, four fans can be used to smooth 500 W of GPU power.

Yet another example implementation smooths 500 W of GPU power using 40 mm fans in a 1U application with acrylonitrile butadiene styrene (ABS) rotors (7 g rotors). The steady-state expected fan speed is 8000 RPM in an AUTO operating speed, which draws 1.4 W per fan. As the GPUs move to a low power state, in order to smooth over the power drop, the 40 mm fans can ramp up to 38,000 RPM in a MAX operating state, which draws up to 31 W per fan. As a result, sixteen fans are used to smooth 500 W of GPU power.

Yet another example implementation smooths 500 W of GPU power using 40 mm fans in a 1U application with steel rotors (52 g rotors). The steady-state expected fan speed is 8000 RPM in an AUTO operating speed, which draws 1.4 W per fan. As the GPUs move to a low power state, in order to smooth over the power drop, the 40 mm fans can ramp up to 38,000 RPM in a MAX operating state, which draws up to 31 W per fan. As a result, ten fans are used to smooth 500 W of GPU power.

The rack controller 232 controls the GPU servers, and the system board for each of the GPU servers includes a baseboard management controller (BMC), such as BMC 228 that is tasked with managing the interface between the GPU server hardware and software running thereon. Various sensors built into the servers, such as temperature sensor 240, report to the BMCs on measured parameters such as GPU power draw, GPU workload, temperature, cooling fan speeds, power status, operating system (OS) status, etc. The rack controller 232 and/or BMCs monitor the sensors and can take thermo-mechanical power smoothing actions in response. For example, the temperature sensors provide feedback control for fan speed in an AUTO operating state.

The GPU processors operate with a synchronous and fluctuating computational workload when used for ML and/or AI model training. This yields a synchronous and fluctuating net power consumption that fluctuates between a minimum power consumption with the array of processors substantially idled when a collecting operation executed at the rack controller 232 or elsewhere between computational workloads is running and a maximum power consumption with the GPU processors fully loaded with computational workload before and after each collecting operation.

The fans are capable of running at variable speeds as demanded by the rack controller 232 and/or BMCs. An action that the rack controller 232 and/or BMCs may take to effect thermo-mechanical power smoothing responsive to (or predictive of) the synchronous and fluctuating net power consumption of the GPU processors is varying the operating speed of the fans. This action turns the fans into thermo-mechanical power smoothing devices that accommodates for the synchronous and fluctuating net power consumption of the GPU processors.

The fans are configured to operate in at least two operating states, AUTO and MAX, as described above. The rack controller 232 and/or BMCs monitor various sensors within the GPU servers and indicators that are responsive to (or predictive of) GPU workload to select the fan operating state. Further, in various implementations, the fan operating state may be selected to be the same across server racks within the data center, across individual GPU servers within a server rack, or across fans within a set of fans within an individual GPU server.

In some implementations, synchronous RPM changes of a large number of fans in a datacenter could induce undesirable harmonics to mechanical systems. In such cases, the rack controller 232 may direct an asynchronous ramp-up and ramp-down of the fans. Thus, the foregoing changes between the MAX and AUTO operating states may be synchronous or asynchronous across all the fans controlled by the rack controller 232. Further, an asynchronous ramp-up and ramp-down of the fans may include setting slightly different maximum fan speeds to avoid harmonic resonance.

While the processors 208, 209, 210 are explicitly disclosed herein as GPUs and the servers within the server rack 230 are explicitly disclosed herein as GPU servers, other server and processor types that function with a periodically and repeatedly fluctuating workload and resulting power consumption may similarly adopt cooling fans operating as thermo-mechanical power smoothing devices. Further, while integrated cooling fans are illustrated in FIG. 2 and described above, external fans (e.g., a rack-mount fan) may be used to similar effect across several connected servers (e.g., all the servers with the rack shared with the rack-mount fan).

Further, while the fans are explicitly described above as specific to individual GPU servers or the server rack 230 containing multiple GPU servers. The thermo-mechanical power smoothing devices disclosed herein may similarly apply to separate fan units, such as fan walls within the server rack 230, external fans used to cool a heat exchanger that in turn is used to cool the GPU server (e.g., via liquid cooling), or even air handling fans for providing heating or air-conditioning to a data center facility.

Figure 3:
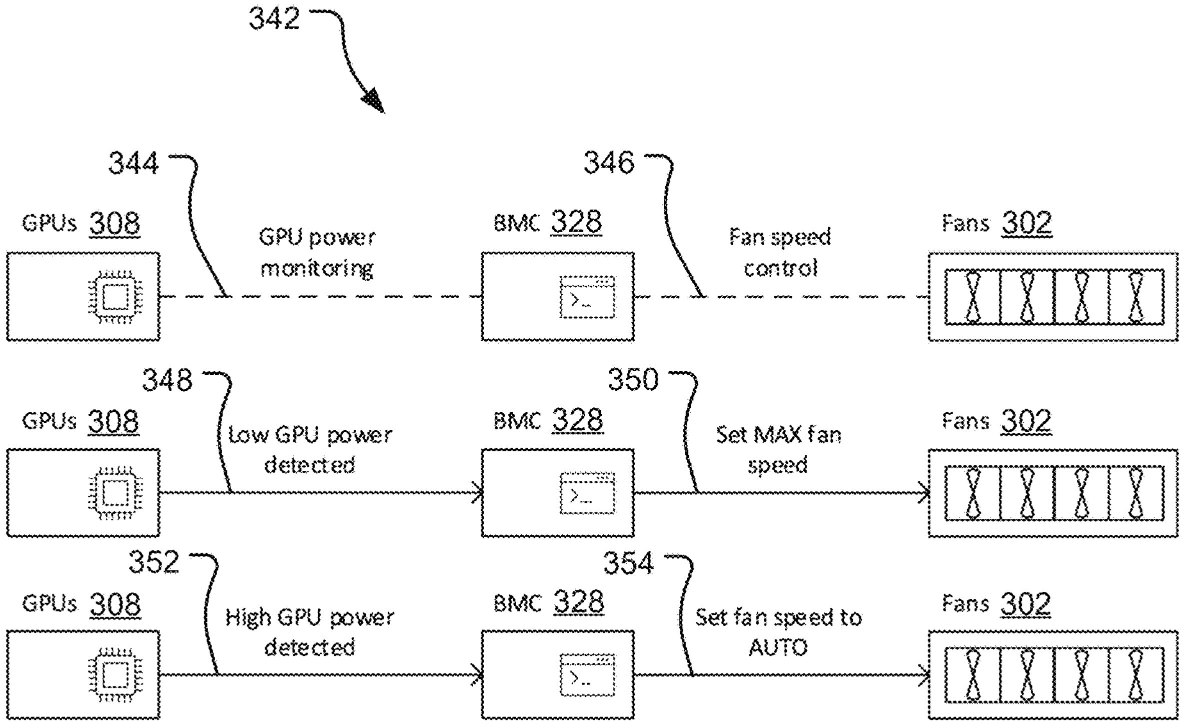
FIG. 3 illustrates an example reactive feedback control scheme for implementing thermo-mechanical power smoothing using a set of cooling fans.

FIG. 3 illustrates an example reactive feedback control scheme 342 for implementing thermo-mechanical power smoothing using a set of cooling fans 302. GPUs 308 as well as other components internal to a GPU server (not shown, see e.g., server 100 of FIG. 1), are convectively cooled by the cooling fans 302 drawing air through an intake, past the GPUs 308 and other internal components of the GPU server that are intended to the convectively cooled, and exhausting the heated air out of the GPU server. A baseboard management controller (BMC) 328 is tasked with managing the interface between the GPU server hardware and software running thereon. Various sensors built into the GPU server report to the BMC 328 on measured parameters such as GPU workload, temperature, cooling fan speeds, power status, operating system (OS) status, etc. The BMC 328 monitors the sensors and can take thermo-mechanical power smoothing actions in response.

The GPUs 308 operate with a synchronous and fluctuating computational workload when used for distributed ML and/or AI model training. This yields a synchronous and fluctuating net power consumption that fluctuates between a minimum power consumption with the array of processors substantially idled when a collecting operation between computational workloads is running and a maximum power consumption with the GPUs 308 fully loaded with computational workload before and after each collecting operation. The BMC 328 is capable of monitoring the power consumption of the GPUs 308 with various sensors, such as voltage or current sensors in power inputs into the GPUs 308, as illustrated by dashed line 344.

The BMC 328 is further capable of controlling operation of the cooling fans 302, as illustrated by dashed line 346. The cooling fans 302 in turn are capable of running at variable speeds as demanded by the BMC 328. An action that the BMC 328 may take to effect thermo-mechanical power smoothing responsive to (or predictive of, see FIG. 4) the synchronous and fluctuating net power consumption of the GPUs 308 is varying the operating speed of the cooling fans 302. This action turns the cooling fans 302 into thermo-mechanical power smoothing devices that accommodates for the synchronous and fluctuating net power consumption of the GPUs 308.

The cooling fans 302 are configured to operate in at least two operating states, MAX and AUTO. When the BMC 328 detects a low power consumption state of the GPUs 308, indicating that the GPUs 308 are substantially idled, as illustrated by solid line 348, the BMC 328 instructs the cooling fans 302 to operate in the MAX operating state, as illustrated by solid line 350. In the MAX operating state, the fan speed to set to maximum and the actual fan speed is permitted to rise to the maximum level. This consumes additional power, which may be helpful from a power smoothing perspective due to the low power consumption state of the GPUs 308. This also stores mechanical energy in the rotors of the cooling fans 302, which may be subsequently consumed at a later time (e.g., when the GPUs 308 move to a high-power consumption state). This further yields a drop in temperature within the GPU server due to the increased airflow though the GPU server. This lower temperature may be used later when the GPUs 308 are again solving a computational workload generating corresponding thermal energy that is to be dissipated (e.g., when the GPUs 308 move to a high-power consumption state).

When the BMC 328 detects a high-power consumption state of the GPUs 308, indicating that the GPUs 308 are again solving a computational workload, as illustrated by solid line 352, the BMC 328 instructs the cooling fans 302 to operate in the automatic or AUTO operating state, as illustrated by solid line 354. In the AUTO operating state, the fan speed is permitted to fluctuate to maintain a desired temperature within the GPU server. More specifically, the BMC 328 monitors one or more temperature sensors (not shown, see e.g., temperature sensor 240 of FIG. 2) that measure temperatures of the airflow, heat sink(s) (not shown, see e.g., heat sink 124), and/or the GPUs 308. In the AUTO operating state, the BMC 328 permits the fan speed to fluctuate to maintain the monitored temperature reading(s) within a desired operating range. The AUTO operating state may be used as the default state for the cooling fans 302.

In a LOW or OFF operating state, the fan speed is set to a minimum, which may be zero when the monitored temperature reading(s) are below a desired operating range. The LOW or OFF operating state may immediately follow the MAX operating state when the GPUs 308 are again solving a computational workload, but the corresponding thermal energy has yet to increase the monitored temperature reading(s) to a sufficient degree to require convection cooling. In some implementations, the LOW or OFF operating state is encompassed by the AUTO operating state, which can set the fan speed to the minimum setting so long as the monitored temperature reading(s) are below the desired operating ranges.

Figure 4:
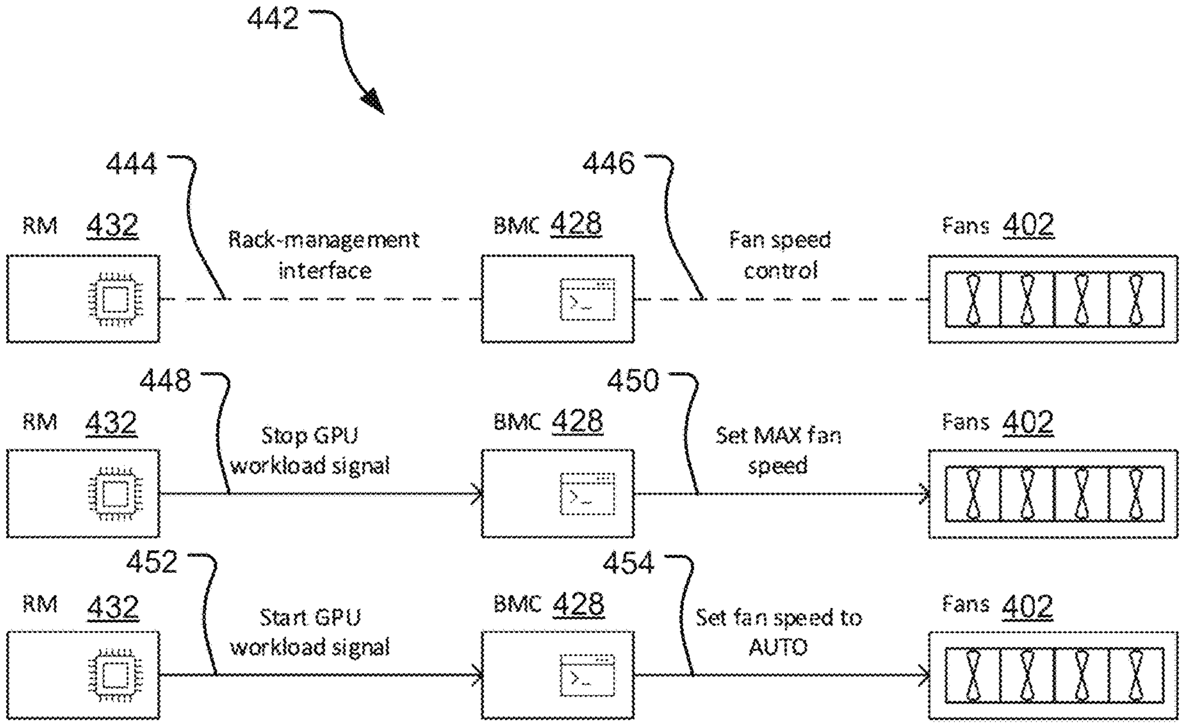
FIG. 4 illustrates an example predictive feedback control scheme for implementing thermo-mechanical power smoothing using a set of cooling fans.

FIG. 4 illustrates an example predictive feedback control scheme 442 for implementing thermo-mechanical power smoothing using a set of cooling fans 402. While the reactive feedback control scheme 342 of FIG. 3 is generally performed at a GPU server level, the predictive feedback control scheme 442 of FIG. 4 is generally performed at the rack level. In other implementations, a predictive feedback control scheme similar to scheme 442 of FIG. 4 could be performed at the GPU server level or a reactive feedback control scheme similar to scheme 342 of FIG. 3 could be performed at the rack level.

A rack manager or controller (RM) 432 controls a set of GPU servers within the rack, and the system board for each of the GPU servers includes a baseboard management controller (BMC), such as BMC 428, that is tasked with managing the interface between the GPU server hardware and software running thereon. GPUs (not shown, see e.g., GPUs 208, 209, 210 of FIG. 2) as well as other components internal to a GPU server (not shown, see e.g., server 100 of FIG. 1), are convectively cooled by the cooling fans 402 drawing air through an intake, past the GPUs and other internal components of the GPU server that are intended to the convectively cooled, and exhausting the heated air out of the GPU server.

The GPUs operate with a synchronous and fluctuating computational workload when used for ML and/or AI model training. This yields a synchronous and fluctuating net power consumption that fluctuates between a minimum power consumption with the array of processors substantially idled when a collecting operation between computational workloads is running and a maximum power consumption with the GPUs fully loaded with computational workload before and after each collecting operation. The RM 432 monitors a rack-management interface for an indication that a collecting operation is commencing or near commencing, as illustrated by dashed line 444, thereby predicting an imminent idling of the GPUs and commensurate drop in power consumption of the GPUs.

The RM 432 is further capable of controlling operation of the cooling fans, through the associated BMC 428, as illustrated by dashed line 446. The cooling fans 402 in turn are capable of running at variable speeds as demanded by the RM 432 through the BMC 428. An action that the RM 432 may take through the BMC 428 to effect thermo-mechanical power smoothing predictive of (or responsive to, see FIG. 3) the synchronous and fluctuating net power consumption of the GPUs is varying the operating speed of the cooling fans 402. This action turns the cooling fans 402 into thermo-mechanical power smoothing devices that accommodates for the synchronous and fluctuating net power consumption of the GPUs.

The cooling fans 402 are configured to operate in at least two operating states, MAX and AUTO. When the RM 432 predicts an upcoming low power consumption state of the GPUs based on a Stop GPU workload signal (indicating an imminent collecting operation), as illustrated by solid line 448, the RM 432 issues the BMC 428 a command to instruct the cooling fans 402 to operate in the MAX operating state, as illustrated by solid line 450. In the MAX operating state, the fan speed to set to maximum and the actual fan speed is permitted to rise to the maximum level. This consumes additional power, which may be helpful from a power smoothing perspective due to the low power consumption state of the GPUs. This also stores mechanical energy in the rotors of the cooling fans 402, which may be subsequently consumed at a later time (e.g., when the GPUs move to a high-power consumption state). This further yields a drop in temperature within the GPU servers due to the increased airflow though the GPU servers. This lower temperature may be used later when the GPUs are again solving a computational workload generating corresponding thermal energy that is to be dissipated (e.g., when the GPUs move to a high-power consumption state).

When the RM 432 predicts an upcoming high-power consumption state of the GPUs based on a Start GPU workload signal (indicating an imminent assigned computational workload), as illustrated by solid line 452, the RM 432 issues the BMC 428 a command to instruct the cooling fans 402 to operate in the automatic or AUTO operating state, as illustrated by solid line 454. In the AUTO operating state, the fan speed is permitted to fluctuate to maintain a desired temperature within the GPU servers. More specifically, the BMC 428 monitors one or more temperature sensors (not shown, see e.g., temperature sensor 240 of FIG. 2) that measure temperatures of the airflow, heat sink(s) (not shown, see e.g., heat sink 124), and/or the GPUs. In the AUTO operating state, the BMC 428 permits the fan speed to fluctuate to maintain the monitored temperature reading(s) within a desired operating range. The AUTO operating state may be used as the default state for the cooling fans 402.

In a LOW or OFF operating state, the fan speed is set to a minimum, which may be zero when the monitored temperature reading(s) are below a desired operating range. The LOW or OFF operating state may immediately follow the MAX operating state when the GPUs are again solving a computational workload, but the corresponding thermal energy has yet to increase the monitored temperature reading(s) to a sufficient degree to require convection cooling. In some implementations, the LOW or OFF operating state is encompassed by the AUTO operating state, which can set the fan speed to the minimum setting so long as the monitored temperature reading(s) are below the desired operating ranges.

Figure 5:
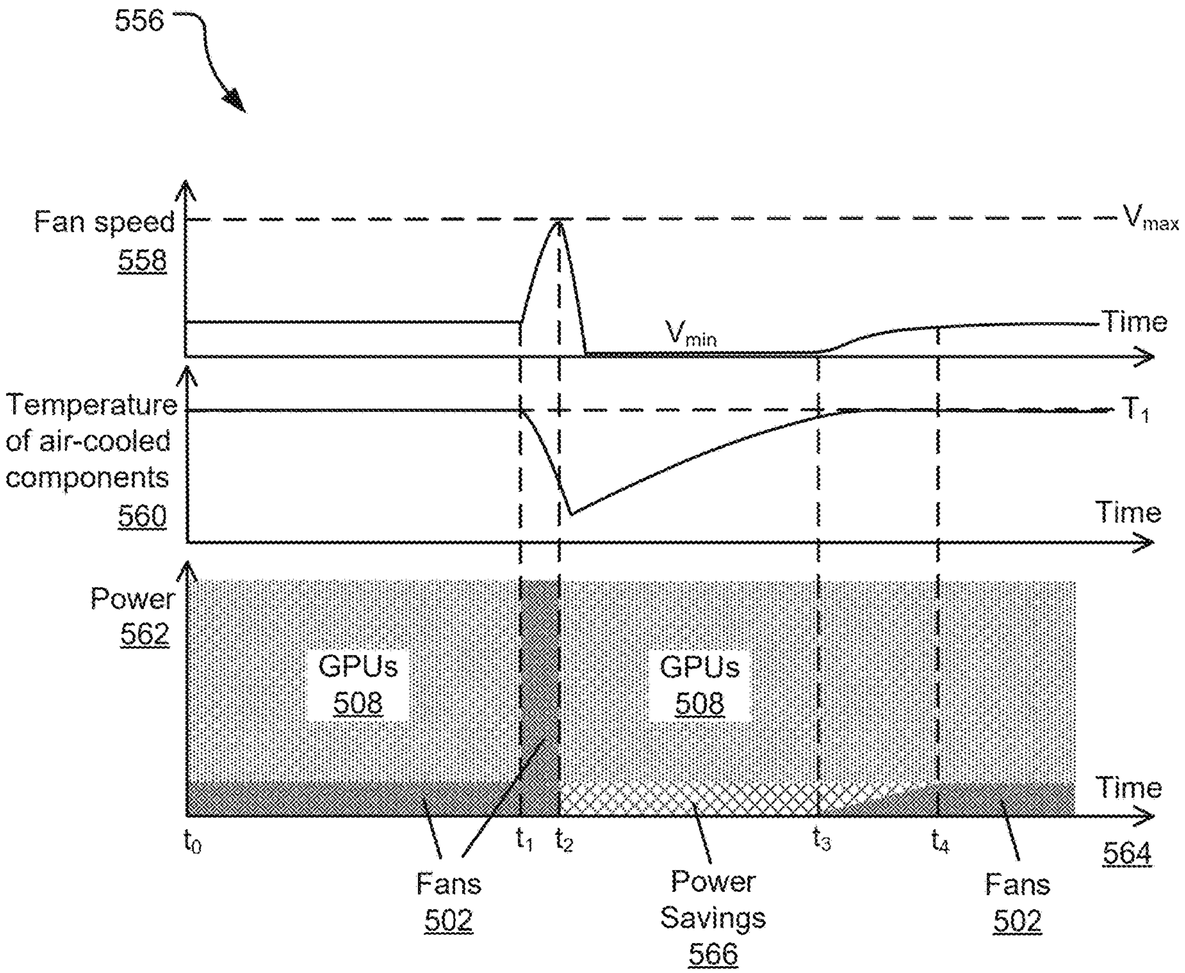
FIG. 5 is an example synchronous load power diagram illustrating operation of cooling fans operating as thermo-mechanical power smoothing devices.

FIG. 5 is an example synchronous load power diagram 556 illustrating operation of cooling fans operating as thermo-mechanical power smoothing devices. The diagram 556 illustrates three distinct graphs, Fan Speed 558, Temperature of Air-Cooled Components 560, and Power Consumption 562 that are aligned in Time 564. The diagram 556 is qualitative in nature and not intended to accurately proportionally express particular fan speeds, temperatures, or power consumption.

Between time to and $t_1$, a GPU server and associated GPUs 508 and cooling fans 502 are operating in an AUTO steady state. The GPU server is tasked with a computational workload and the GPUs therein are in a high-power consumption state. The fans 502 use a feedback control loop and running at a speed to maintain the Temperature of Air-Cooled Components at $T_1$.

At time $t_1$, the GPUs 508 abruptly go to an idle state in response to a collecting operation that interrupts the computational workload. The causes the GPUs 508 power consumption to rapidly drop to a low power consumption state. To counteract this effect and achieve thermo-mechanical power smoothing, the GPU server triggers the cooling fans 502 to consume the now available extra power. Between time $t_1$ and $t_2$, the cooling fans 502 run in a MAX operating state, which allows the cooling fans 502 to consume the power previously consumed by the GPUs 508 and avoid much, if any dip in overall power consumption. The MAX operating state causes the Fan Speed 558 to ramp up to a maximum speed ($V_{max}$) to store mechanical energy within the cooling fans 502. This also causes a super-cooling effect within the GPU server, as illustrated by the falling Temperature of Air-Cooled Components 560 below $T_1$. This super-cooling effect may also be considered thermal energy storage as the GPU server is not required to operate at the super-cooled temperature and the super-cooling effect may yield Power Savings 566 between time $t_2$ and $t_3$.

At time $t_2$, the GPUs 508 are assigned a new computational workload and abruptly go back to a high-power consumption state. This triggers the cooling fans 502 to return to the AUTO operating state. As the Temperature of Air-Cooled Components 560 is below $T_1$, the fan speed drops to $V_{min}$, which may be relatively low speed or zero. Absent a regenerative braking mechanism, the fans free-wheel to slow down gradually. If a regenerative braking mechanism is present, the fans decelerate faster and return a portion of the fan energy to the GPU server as electrical power. The regenerative braking mechanism may further function as a UPS to bridge momentary power interruptions. As the fans are consuming little, if any power, this yields the Power Savings 566 noted above until time $t_3$.

At time $t_3$, the Temperature of Air-Cooled Components 560 approaches $T_1$. This causes the fan speed to ramp back to approach the initial steady state speed between time to and $t_1$. This increase in Fan Speed 558 causes a similar increase in Power Consumption 562 by the fans between time $t_3$ and $t_4$. At time $t_4$, the Fan Speed 558, Temperature of Air-Cooled Components 560, and Power Consumption 562 have all returned to a steady-state similar to or the same as the steady state between time $t_0$ and $t_1$. This may remain the case until the GPUs 508 again abruptly go to an idle state in response to another collecting operation that interrupts the computational workload, similar that at time $t_1$. The foregoing process then repeats iteratively as the GPUs 508 shift between high and low power consumption states.

Figure 6:
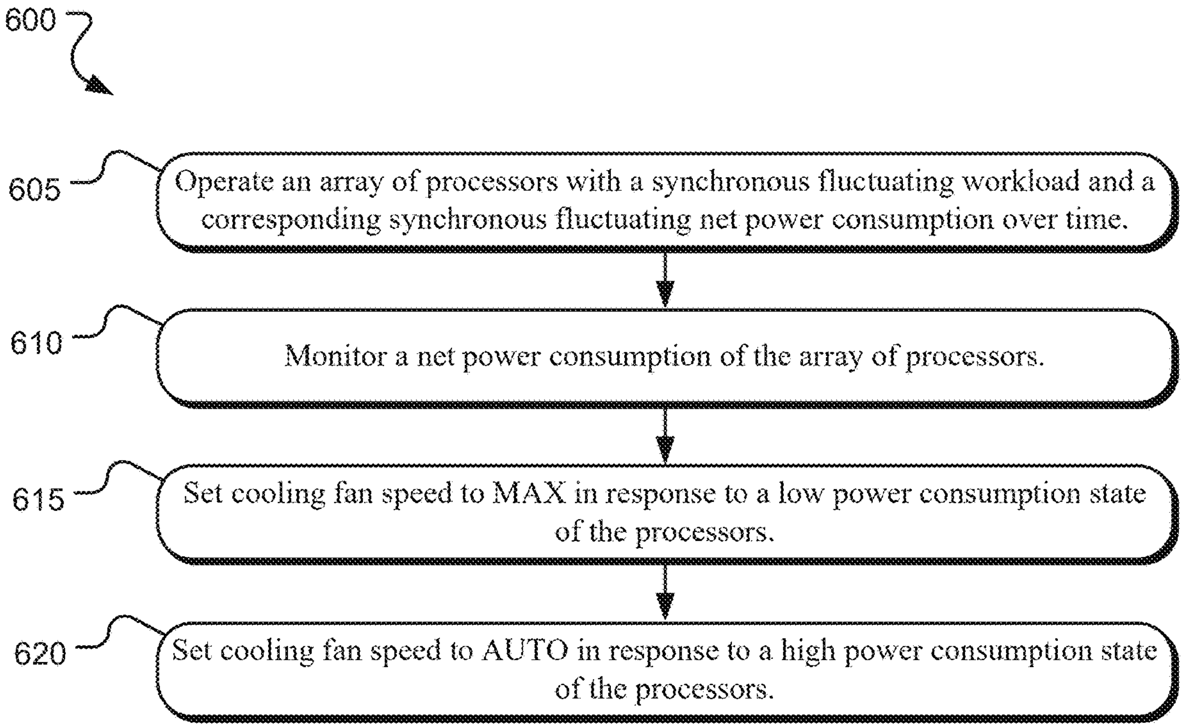
FIG. 6 illustrates example operations for using cooling fans operating as thermo-mechanical power smoothing devices.

FIG. 6 illustrates example operations 600 for using cooling fans operating as thermo-mechanical power smoothing devices. The operations 600 are intended to achieve thermo-mechanical power smoothing for one or more servers, potentially within a server rack or even across a data center.

An operating operation 605 operates an array of processors with a synchronous fluctuating workload and a corresponding synchronous fluctuating net power consumption over time. An array of variable speed cooling fans supply cooling air to the processors and operate as thermo-mechanical power smoothing devices for the server(s).

A monitoring operation 610 monitors a net power consumption of the array of processors. In various implementations, the monitoring operation 610 may be reactive or predictive. For example, the monitoring operation 610 may monitor and reacts to detected changes in the net power consumption of the processors. For further example, the monitoring operation 610 may monitor stop and start workload signals and predict changes in the net power consumption of the processors responsive to receipt of the stop and start workload signals.

A controller (e.g., a rack manager or a BMC) is capable of changes fan operating states responsive to the monitoring operation 610. A first setting operation 615 sets cooling fan speed to MAX in response to a low power consumption state of the processors. A second setting operation 620 sets cooling fan speed to AUTO in response to a high-power consumption state of the processors. The monitoring operation 610 runs continuously and the setting operations 615, 620 repeat as directed by the controller based on the changing power consumption of the array of processors. While specific examples of controllers are provided herein (e.g., rack managers and BMCs), the controllers are contemplated as operating similarly at a variety of scales, such as server-scale, rack-scale, row-scale, co-location scale, datacenter scale, etc. The primary difference is how many fans the controller is responsible for, but the control schemes described herein can be scaled as appropriate.

The operations making up the embodiments of the invention described herein are referred to variously as operations, steps, objects, or modules. The operations may be performed in any order, adding or omitting operations as desired, unless explicitly claimed otherwise or a specific order is inherently necessitated by the claim language.

The servers and computing devices disclosed herein may include a variety of tangible computer-readable storage media (e.g., the memory device(s) and the storage media device(s)) and intangible computer-readable communication signals. Tangible computer-readable storage can be embodied by any available media that can be accessed by the computing devices and includes both volatile and non-volatile storage media, as well as removable and non-removable storage media implemented in any method or technology for storage of information such as computer readable instructions, data structures, program modules or other data. Tangible computer-readable storage media includes, but is not limited to, RAM, read-only memory (ROM), electrically erasable programmable read-only memory (EEPROM), flash memory or other memory technology, compact disc read-only memory (CD-ROM), digital versatile disks (DVD) or other optical disk storage, magnetic cassettes, magnetic tape, magnetic disk storage or other magnetic storage devices, or any other tangible medium which can be used to store the desired information and which can be accessed by the computing devices. Tangible computer-readable storage media excludes intangible communications signals.

Intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include signals traveling through wired media such as a wired network or direct-wired connection, and wireless media such as acoustic, radio-frequency (RF), infrared (IR), and other wireless media.

Some implementations may comprise an article of manufacture. An article of manufacture may comprise a tangible storage medium to store logic. Examples of a storage medium may include one or more types of computer-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, operation segments, methods, procedures, software interfaces, application program interfaces (APIs), instruction sets, computing code, computer code, code segments, computer code segments, words, values, symbols, or any combination thereof. In one embodiment, for example, an article of manufacture may store executable computer program instructions that, when executed by a computer, cause the computer to perform methods and/or operations in accordance with the described embodiments. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain operation segment. The instructions may be implemented using any suitable high-level, low-level, object-oriented, visual, compiled and/or interpreted programming language.

Implementations described herein include a server comprising an array of processors to operate with a synchronous fluctuating workload and a corresponding synchronous fluctuating net power consumption over time, an array of variable speed cooling fans to supply cooling air to the processors and operate as thermo-mechanical power smoothing devices for the server, and a controller to. The controller is to set cooling fan speed to MAX in response to a low power consumption state of the processors, and set cooling fan speed to AUTO in response to a high-power consumption state of the processors.

The processors may be graphical processing units (GPUs) to solve computational workload for training one or both of machine-learning (ML) and artificial intelligence (AI) models.

The synchronous fluctuating net power consumption may fluctuate between a minimum power consumption with the array of processors substantially idled and a maximum power consumption with the array of processors fully loaded with a computational workload.

The controller may be a baseboard management controller (BMC) for the server.

The power consumption state of the processors may be detected or anticipated by the BMC.

The server may further comprise one or more heat sinks to add thermal storage capacity to the server.

The variable speed cooling fans may include weighted rotors to add mechanical storage capacity to the server.

The server may further comprise a regenerative braking mechanism connected to one or more of the cooling fans, the regenerative braking mechanism to recover mechanical storage capacity as electrical power for the server.

The regenerative braking mechanism may function as a universal power supply (UPS) to bridge momentary interruptions of power.

The server may further comprise one or more temperature sensors to provide feedback control for fan speed in AUTO.

Additional mechanical energy may be stored within the cooling fans when operating in the MAX fan speed state to be subsequently consumed responsive to the processors moving to the high-power consumption state.

Additional thermal energy may be released into a convective airflow when the cooling fans are operating in the MAX fan speed state to be subsequently recovered responsive to the processors moving to the high-power consumption state.

Implementations described herein include a method of performing thermo-mechanical power smoothing for a server. The method comprises operating an array of processors with a synchronous fluctuating workload and a corresponding synchronous fluctuating net power consumption over time, wherein an array of variable speed cooling fans supply cooling air to the processors and operate as thermo-mechanical power smoothing devices for the server, monitoring a net power consumption of the array of processors, setting cooling fan speed to MAX in response to a low power consumption state of the processors, and setting cooling fan speed to AUTO in response to a high-power consumption state of the processors.

The monitoring operation may react to detected changes in the net power consumption of the processors.

The monitoring operation may predict changes in the net power consumption of the processors responsive to receipt of stop and start workload signals.

Implementations described herein include a server rack comprising an array of servers, each server including an array of processors to operate with a synchronous fluctuating workload and a corresponding synchronous fluctuating net power consumption over time, an array of variable speed cooling fans to supply cooling air to the processors and operate as thermo-mechanical power smoothing devices for the array of servers, and a controller. The controller is to set cooling fan speed to MAX in response to a low power consumption state of the processors, and set cooling fan speed to AUTO in response to a high-power consumption state of the processors.

The array of variable speed cooling fans may cool the server rack or one of the array of servers therein.

The controller may be one of a datacenter controller for the server rack and multiple other server racks, a rack controller for the server rack, or a baseboard management controller (BMC) for one of the array of servers within the server rack.

The controller may execute asynchronous changes in cooling fan speed across the array of variable speed cooling fans.

The processors may be graphical processing units (GPUs) to solve computational workload for training one or both of machine-learning (ML) and artificial intelligence (AI) models.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A server comprising:

an array of processors to operate with a synchronous fluctuating workload and a corresponding synchronous fluctuating net power consumption over time;

an array of variable speed cooling fans to supply cooling air to the processors and operate as thermo-mechanical power smoothing devices for the server; and a controller to:

set cooling fan speed to MAX in response to a low power consumption state of the processors; and set cooling fan speed to AUTO in response to a high-power consumption state of the processors.

2. The server of claim 1, wherein the processors are graphical processing units (GPUs) to solve computational workload for training one or both of machine-learning (ML) and artificial intelligence (AI) models.

3. The server of claim 1, wherein the synchronous fluctuating net power consumption fluctuates between a minimum power consumption with the array of processors substantially idled and a maximum power consumption with the array of processors fully loaded with a computational workload.

4. The server of claim 1, wherein the controller is a baseboard management controller (BMC) for the server.

5. The server of claim 4, wherein power consumption state of the processors is detected or anticipated by the BMC.

6. The server of claim 1, further comprising:

one or more heat sinks to add thermal storage capacity to the server.

7. The server of claim 1, wherein the variable speed cooling fans include weighted rotors to add mechanical storage capacity to the server.

8. The server of claim 1, further comprising:

a regenerative braking mechanism connected to one or more of the cooling fans, the regenerative braking mechanism to recover mechanical storage capacity as electrical power for the server.

9. The server of claim 8, wherein the regenerative braking mechanism functions as a universal power supply (UPS) to bridge momentary interruptions of power.

10. The server of claim 1, further comprising:

one or more temperature sensors to provide feedback control for fan speed in AUTO.

11. The server of claim 1, wherein:

additional mechanical energy is stored within the cooling fans when operating in the MAX fan speed state to be subsequently consumed responsive to the processors moving to the high-power consumption state.

12. The server of claim 1, wherein:

additional thermal energy is released into a convective airflow when the cooling fans are operating in the MAX fan speed state to be subsequently recovered responsive to the processors moving to the high-power consumption state.

13. A method of performing thermo-mechanical power smoothing for a server comprising:

operating an array of processors with a synchronous fluctuating workload and a corresponding synchronous fluctuating net power consumption over time, wherein an array of variable speed cooling fans supply cooling air to the processors and operate as thermo-mechanical power smoothing devices for the server;

monitoring a net power consumption of the array of processors;

setting cooling fan speed to MAX in response to a low power consumption state of the processors; and setting cooling fan speed to AUTO in response to a high-power consumption state of the processors.

14. The method of claim 13, wherein the monitoring operation reacts to detected changes in the net power consumption of the processors.

15. The method of claim 13, wherein the monitoring operation predicts changes in the net power consumption of the processors responsive to receipt of stop and start workload signals.

16. A server rack comprising:

an array of servers, each server including an array of processors to operate with a synchronous fluctuating workload and a corresponding synchronous fluctuating net power consumption over time;

an array of variable speed cooling fans to supply cooling air to the processors and operate as thermo-mechanical power smoothing devices for the array of servers; and a controller to:

set cooling fan speed to MAX in response to a low power consumption state of the processors; and set cooling fan speed to AUTO in response to a high-power consumption state of the processors.

17. The server rack of claim 16, wherein the array of variable speed cooling fans cool the server rack or one of the array of servers therein.

18. The server rack of claim 16, wherein the controller is one of a datacenter controller for the server rack and multiple other server racks, a rack controller for the server rack, or a baseboard management controller (BMC) for one of the array of servers within the server rack.

19. The server rack of claim 16, wherein the controller executes asynchronous changes in cooling fan speed across the array of variable speed cooling fans.

20. The server rack of claim 16, wherein the processors are graphical processing units (GPUs) to solve computational workload for training one or both of machine-learning (ML) and artificial intelligence (AI) models.

* * * * *